United States Patent
Gadkaree et al.

(10) Patent No.: US 7,691,730 B2
(45) Date of Patent: Apr. 6, 2010

(54) LARGE AREA SEMICONDUCTOR ON GLASS INSULATOR

(75) Inventors: Kishor Purushottam Gadkaree, Big Flats, NY (US); Alexandre Michel Mayolet, Auneau (FR)

(73) Assignee: Corning Incorporated, Corning, NY (US)

(*) Notice: Subject to any disclaimer, the term of this patent is extended or adjusted under 35 U.S.C. 154(b) by 675 days.

(21) Appl. No.: 11/517,908

(22) Filed: Sep. 8, 2006

(65) Prior Publication Data

US 2007/0117354 A1    May 24, 2007

(51) Int. Cl.
*H01L 21/36* (2006.01)
(52) U.S. Cl. .................. 438/479; 438/455
(58) Field of Classification Search .......... 438/455, 438/479, 481
See application file for complete search history.

(56) References Cited

U.S. PATENT DOCUMENTS

| | | | |
|---|---|---|---|
| 5,206,749 A | 4/1993 | Zavracky et al. | 349/45 |
| 5,256,562 A | 10/1993 | Vu et al. | 438/28 |
| 5,258,325 A | 11/1993 | Spitzer et al. | 438/107 |
| 5,300,788 A | 4/1994 | Fan et al. | 257/13 |
| 5,374,564 A | 12/1994 | Bruel | 438/455 |
| 5,376,561 A | 12/1994 | Vu et al. | 438/118 |
| 5,377,031 A | 12/1994 | Vu et al. | 349/45 |
| 5,499,124 A | 3/1996 | Vu et al. | 349/45 |
| 5,559,043 A | 9/1996 | Bruel | 438/407 |
| 5,656,844 A | 8/1997 | Klein et al. | 257/347 |
| 5,757,445 A | 5/1998 | Vu et al. | 349/45 |
| 6,093,623 A | 7/2000 | Forbes | 438/455 |
| 6,140,209 A | 10/2000 | Iwane et al. | 438/458 |
| 6,211,041 B1 | 4/2001 | Ogura | 438/458 |
| 6,309,950 B1 | 10/2001 | Forbes | 438/455 |
| 6,323,108 B1 | 11/2001 | Kub et al. | 438/458 |
| 6,335,231 B1 | 1/2002 | Yamazaki et al. | 438/151 |
| 6,376,337 B1 | 4/2002 | Wang et al. | 438/478 |
| 6,391,740 B1 | 5/2002 | Cheung et al. | 438/455 |
| 6,461,939 B1 | 10/2002 | Furihata et al. | 438/459 |
| 6,486,929 B1 | 11/2002 | Vu et al. | 349/45 |
| 6,593,978 B2 | 7/2003 | Vu et al. | 349/45 |
| 6,818,529 B2 | 11/2004 | Bachrach et al. | 438/455 |

(Continued)

FOREIGN PATENT DOCUMENTS

EP    1398825    3/2004 .......... 21/20

(Continued)

*Primary Examiner*—Bradley K Smith
(74) *Attorney, Agent, or Firm*—Bruce P. Watson; Timothy M. Schaeberle; Matthew B. Dernier

(57) ABSTRACT

Methods and apparatus provide for contacting respective first surfaces of a plurality of donor semiconductor wafers with a glass substrate; bonding the first surfaces of the plurality of donor semiconductor wafers to the glass substrate using electrolysis; separating the plurality of donor semiconductor wafers from the glass substrate leaving respective exfoliation layers bonded to the glass substrate; and depositing a further semiconductor layer on exposed surfaces of the exfoliation layers to augment a thickness of the exfoliation layers.

12 Claims, 14 Drawing Sheets

U.S. PATENT DOCUMENTS

| | | |
|---|---|---|
| 6,919,935 B2 | 7/2005 | Vu et al. .................... 349/45 |
| 6,946,317 B2 | 9/2005 | Faure et al. |
| 6,995,427 B2 | 2/2006 | Aulnette et al. |
| 7,018,910 B2 | 3/2006 | Ghyselen et al. |
| 7,232,488 B2 | 6/2007 | Akatsu et al. |
| 2004/0156233 A1 | 8/2004 | Bhattacharyya ............ 365/176 |
| 2004/0219370 A1 | 11/2004 | Aga et al. .................. 428/446 |
| 2004/0229444 A1* | 11/2004 | Couillard et al. ............ 438/455 |
| 2006/0073679 A1* | 4/2006 | Airaksinen et al. .......... 438/478 |
| 2006/0234477 A1 | 10/2006 | Gadkaree .................... 438/478 |

FOREIGN PATENT DOCUMENTS

| | | | |
|---|---|---|---|
| WO | WO/9205575 | 4/1992 | .................... 21/20 |
| WO | WO/2005029575 | 3/2005 | .................. 21/762 |

* cited by examiner

100

FIG. 17
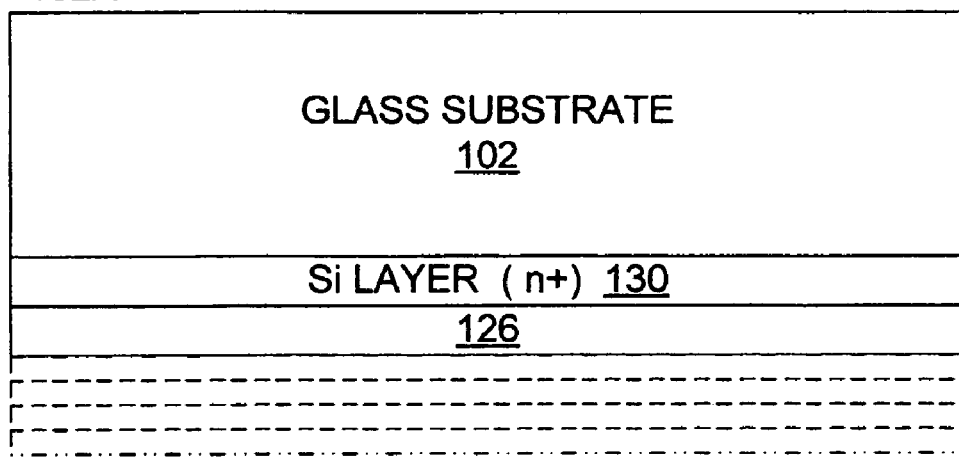
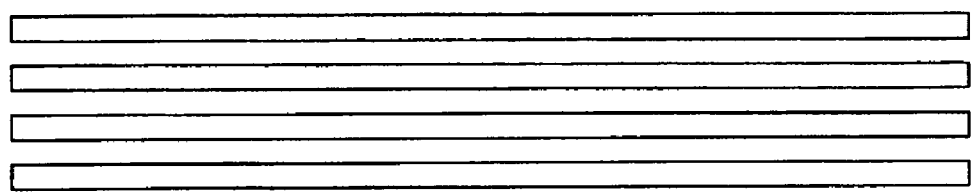
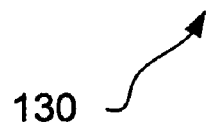

LARGE AREA SEMICONDUCTOR ON GLASS INSULATOR

BACKGROUND

The present invention relates to semiconductor-on-insulator (SOI) structures, such as semiconductor on glass or glass ceramic, and methods for making same.

To date, the semiconductor material most commonly used in semiconductor-on-insulator structures has been silicon. Such structures have been referred to in the literature as silicon-on-insulator structures and the abbreviation "SOI" has been applied to such structures. Silicon-on-insulator technology is becoming increasingly important for high performance photovoltaic applications (e.g., solar cells), thin film transistor applications, and displays, such as, active matrix displays. Known silicon-on-insulator wafers consist of a thin layer of substantially single crystal silicon (generally 0.1-0.3 microns in thickness but, in some cases, as thick as 5 microns) on an insulating material.

For ease of presentation, the following discussion will at times be in terms of silicon-on-insulator structures. The references to this particular type of semiconductor-on-insulator structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SOG abbreviation is used to refer to semiconductor-on-glass structures in general, including, but not limited to, silicon-on-glass structures. The SOG nomenclature is also intended to include semiconductor-on-glass-ceramic structures, including, but not limited to, silicon-on-glass-ceramic structures. The abbreviation SOI encompasses SOG structures.

The various ways of obtaining SOI structures include epitaxial growth of Si on lattice matched substrates. An alternative process includes the bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

Exfoliation by the hydrogen ion implantation method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond. The wafers are then heat-treated to about 600 degrees C. to cause growth of the subsurface flaws for use in separating a thin layer of silicon from the Si wafer. The resulting assembly is then heated to a temperature above 1,000 degrees C. to fully bond the Si film with $SiO_2$ underlayer to the support substrate, i.e., the unimplanted Si wafer. This process thus forms an SOI structure with a thin film of silicon bonded to another silicon wafer with an oxide insulator layer in between.

Cost is an important consideration for commercial applications of SOI structures. To date, a major part of the cost of the above-described method and structure has been the cost of the silicon wafer which supports the oxide layer, topped by the Si thin film, i.e., a major part of the cost has been the support substrate. Although the use of quartz as a support substrate has been mentioned in various patents (see U.S. Pat. Nos. 6,140,209 6,211,041, 6,309,950, 6,323,108, 6,335,231, and 6,391,740), quartz is itself a relatively expensive material. In discussing support substrates, some of the above references have mentioned quartz glass, glass, and glass-ceramics. Other support substrate materials listed in these references include diamond, sapphire, silicon carbide, silicon nitride, ceramics, metals, and plastics.

U.S. Pat. No. 5,374,564 discloses a process to obtain a single crystal silicon film on a substrate using a thermal process. A semiconductor material wafer having a planar face is subject to the following steps: (i) implantation by bombardment of a face of the wafer by means of ions creating a layer of gaseous micro-bubbles defining a lower region constituting the mass of the substrate and an upper region constituting the thin film; (ii) contacting the planar face of the wafer with a stiffener constituted by at least one rigid material layer; and (iii) a third stage of heat treating the assembly of the wafer and the stiffener at a temperature above that at which the ion bombardment was carried out and sufficient to create a pressure effect in the micro-bubbles and a separation between the thin film and the mass of the substrate. Due to the high temperature steps, this process does not work with lower cost glass or glass-ceramic substrates.

U.S. Patent Application No.: 2004/0229444 discloses a process for producing a SOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer. The SOI formation technique disclosed in U.S. Patent Application No.: 2004/0229444 has been shown to result in a relatively thin semiconductor layer (e.g., about 1-5 um) bonded to a glass substrate. While this semiconductor thickness is sufficient for some if not most applications, such may not provide a satisfactory layer thickness in other applications.

In addition, for large area electronic or photovoltaic applications, the resulting SOG structure should be greater than about 0.17 square meters, and preferably greater than about 1 square meter. The re-use of donor semiconductor wafers has a relatively significant impact on the cost to produce an SOG structure, particularly a large area SOG structure. Donor semiconductor re-use—which is presently the dominant and limiting factor impacting the process cost—defines how many times a given donor semiconductor wafer can be used during the bonding process to produce SOG structure(s). The re-use factor is even more important when a large area SOG is being produced using separate semiconductor layer structures laterally disposed over a given glass substrate. For such a process, it is desirable to re-use a given donor semiconductor wafer at least hundred times.

SUMMARY OF THE INVENTION

In accordance with one or more embodiments of the present invention, methods and apparatus provide for: contacting respective first surfaces of a plurality of donor semiconductor wafers with a glass substrate; bonding the first surfaces of the plurality of donor semiconductor wafers to the glass substrate using electrolysis; separating the plurality of donor semiconductor wafers from the glass substrate leaving respective exfoliation layers bonded to the glass substrate; and depositing a further semiconductor layer on exposed surfaces of the exfoliation layers to augment a thickness of the exfoliation layers.

The step of depositing the further semiconductor layer may include using at least one of thermal oxidation, chemical vapor deposition, sol-gel, and sputtering to deposit the further semiconductor layer on the exfoliation layers. The deposited semiconductor layer may be at least 1 um thick, between about 1 to 50 um thick, between about 50 to 100 um thick, or greater than 100 um thick.

At least some voids between adjacent exfoliation layers are preferably filled to result in a substantially uniform single crystal semiconductor layer bonded to the glass substrate. The voids between adjacent exfoliation layers may be filled by permitting at least some of the further semiconductor layer to at least partially fill such voids through lateral epitaxy.

An area of the glass substrate covered by the plurality of exfoliation layers may be at least 0.15 square meters, or greater, such as at least 1.0 square meters.

At least one of the donor semiconductor wafers and the further semiconductor layer are taken from the group consisting of: silicon (Si), germanium-doped silicon (SiGe), silicon carbide (SiC), germanium (Ge) gallium arsenide (GaAs), GaP, and InP.

The glass substrate may be a glass ceramic substrate.

The step of bonding may include: heating at least one of the glass substrate and the semiconductor wafer; applying pressure to urge the glass substrate into direct or indirect contact with the donor semiconductor wafers; and applying a voltage potential across the glass substrate and the donor semiconductor wafers to induce the bond.

In accordance with one or more further embodiments of the present invention, respective first surfaces of the plurality of donor semiconductor wafers may be bonded to a conductive carrier substrate before bonding the donor semiconductor wafers to the glass substrate. The newly exposed second surfaces of the donor semiconductor wafers may then be polished and respective exfoliation layers formed by performing ion implantation to create respective areas of weakening below the newly exposed second surfaces. Thereafter, the second surfaces of the plurality of donor semiconductor wafers may be bonded to another glass substrate using electrolysis and separated leaving respective exfoliation layers bonded to the other glass substrate. A further semiconductor layer is then disposed on exposed surfaces of the exfoliation layers to augment a thickness of the exfoliation layers.

In accordance with one or more further embodiments of the present invention, a method of forming a semiconductor on glass structure includes at least one of: depositing a donor semiconductor layer on a seed semiconductor layer, where the donor semiconductor layer is of about 0.1 square meters or more; contacting a first surface of the donor semiconductor layer with a glass substrate; bonding the first surface of the donor semiconductor layer to the glass substrate using electrolysis; and separating the donor semiconductor layer from the glass substrate leaving an exfoliation layer bonded to the glass substrate.

In accordance with one or more further embodiments of the present invention, a method of forming a semiconductor on glass structure includes at least one of: bonding a plurality of semiconductor layers to a substrate to cover about 0.1 square meters or more of the substrate; depositing a donor semiconductor layer on exposed surfaces of the bonded semiconductor layers to augment a thickness thereof; contacting a first surface of the donor semiconductor layer with a glass substrate; bonding the first surface of the donor semiconductor layer to the glass substrate using electrolysis; and separating the donor semiconductor layer from the glass substrate leaving an exfoliation layer bonded to the glass substrate.

In accordance with one or more further embodiments of the present invention, a method of forming a semiconductor on glass structure includes at least one of: bonding a plurality of semiconductor layers to a substrate to cover about 0.1 square meters or more of the substrate; depositing a donor semiconductor layer on exposed surfaces of the bonded semiconductor layers to augment a thickness thereof; contacting a first surface of the donor semiconductor layer with a glass substrate; bonding the first surface of the donor semiconductor layer to the glass substrate using electrolysis; separating the donor semiconductor layer from the glass substrate leaving an exfoliation layer bonded to the glass substrate; depositing a further donor semiconductor layer on an exposed surface of the exfoliation layer to augment a thickness thereof; contacting a first surface of the exfoliation layer with a further glass substrate; bonding the first surface of the exfoliation layer to the glass substrate using electrolysis; and separating the further donor semiconductor layer from the further glass substrate leaving a further exfoliation layer bonded to the further glass substrate.

Advantageously, a relatively large glass substrate may be achieved having a uniform single crystal silicon film in a single bonding step. Various embodiments of the invention may be used in photovoltaic applications because the size of the glass substrate in such applications is generally larger than 1.0 square meters. Various embodiments of the invention provide a cost effective process to achieve a large-sized SOG product, in which a thickness of the bonded silicon layer is relatively large, such as 10-100 microns or more.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIGS. 15-17 are schematic diagrams of still further intermediate structures that may be used in the formation of a plurality of SOI structures in accordance with one or more aspects of the present invention.

DETAILED DESCRIPTION OF THE PRESENT INVENTION

Figure 1:
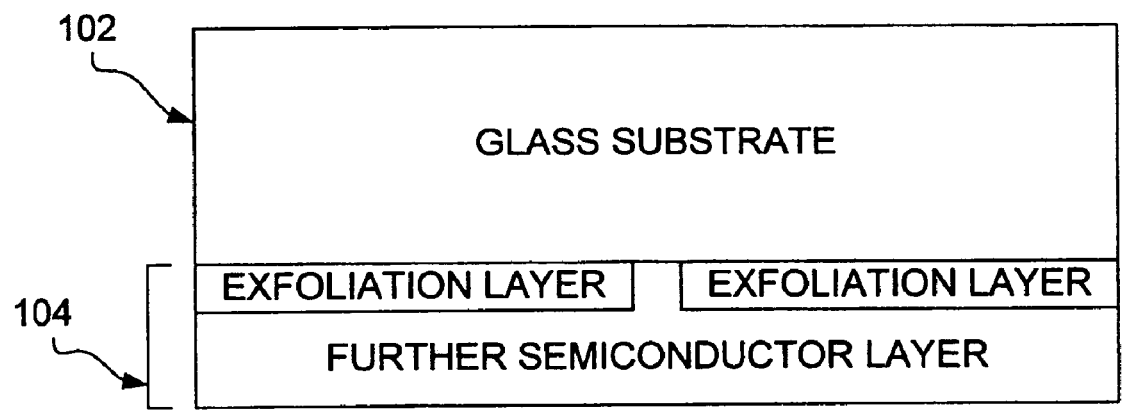
FIG. 1 is a block diagram illustrating the structure of an SOI device in accordance with one or more embodiments of the present invention.

With reference to the drawings, wherein like numerals indicate like elements, there is shown in FIG. 1 an SOG structure 100 in accordance with one or more embodiments of the present invention. The SOG structure 100 preferably includes a glass substrate 102 and a semiconductor layer 104. The SOG structure 100 has suitable uses in connection with fabricating thin film transistor devices, e.g., photovoltaic devices, integrated circuits, and for display applications, including organic light-emitting diode (OLED) displays and liquid crystal displays (LCDs), etc.

The semiconductor material of the layer 104 is preferably in the form of a substantially single-crystal material. The word "substantially" is used in describing the layer 104 to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The glass substrate 102 is preferably formed from an oxide glass or an oxide glass-ceramic. Although not required, the embodiments described herein preferably include an oxide glass or glass-ceramic exhibiting a strain point of less than about 1,000 degrees C. As is conventional in the glass making art, the strain point is the temperature at which the glass or glass-ceramic has a Viscosity Of $10^{14.6}$ poise ($10^{13.6}$ Pa·s). As between oxide glasses and oxide glass-ceramics, the glasses are presently preferred because they are typically simpler to manufacture, thus making them more widely available and less expensive.

By way of example, the glass substrate 102 may be formed from glass substrates containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

The glass substrate preferably has a thickness in the range of about 0.1 mm to about 10 mm and most preferably in the range of about 0.5 mm to about 3 mm. For some SOI structures, insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a glass substrate 102 having a thickness that is greater than or equal to about 1 micron. A preferred lower limit on the thickness of the glass substrate 102 is thus about 1 micron.

In general, the glass substrate 102 should be thick enough to support the semiconductor layer 104 through the process steps of the invention, as well as subsequent processing performed on the SOG structure 100. Although there is no theoretical upper limit on the thickness of the glass substrate 102, a thickness beyond that needed for the support function or that desired for the ultimate SOG structure 100 is generally not preferred since the greater the thickness of the glass substrate 102, the more difficult it will be to accomplish at least some of the process steps in forming the SOG structure 100.

The oxide glass or oxide glass-ceramic substrate 102 is preferably silica-based. Thus, the mole percent of $SiO_2$ in the oxide glass or oxide glass-ceramic is preferably greater than 30 mole % and most preferably greater than 40 mole %. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less preferred because of their higher cost and/or inferior performance characteristics. Similarly, for some applications, e.g., for SOI structures employing semiconductor materials that are not silicon-based, glass substrates which are not oxide based, e.g., non-oxide glasses, may be desirable, but are generally not preferred because of their higher cost. As will be discussed in more detail below, in one or more embodiments, the glass or glass-ceramic substrate 102 is designed to match a coefficient of thermal expansion (CTE) of one or more semiconductor materials (e.g., silicon, germanium, etc.) that are bonded thereto. For example, semiconductor material may be deposited via CVD growth directly or indirectly on the glass substrate 102. The CTE match ensures desirable mechanical properties during heating cycles of the deposition process.

For certain applications, e.g., photovoltaic and/or display applications, the glass or glass-ceramic 102 is preferably transparent in the visible, near UV, and/or IR wavelength ranges, e.g., the glass or glass ceramic 102 is preferably transparent in the 350 nm to 2 micron wavelength range. In one or more embodiments, the glass or glass-ceramic substrate 102 remains substantially transparent to light of desired wavelengths during a semiconductor deposition process (specifically a heating cycle thereof) to which the glass substrate 102 will be subject. This feature will be discussed in more detail later in this description regarding photovoltaic applications.

Although the glass substrate 102 is preferably composed of a single glass or glass-ceramic layer, laminated structures can be used if desired. When laminated structures are used, the layer of the laminate closest to the semiconductor layer 104 preferably has the properties discussed herein for a glass substrate 102 composed of a single glass or glass-ceramic. Layers farther from the semiconductor layer 104 preferably also have those properties, but may have relaxed properties because they do not directly interact with the semiconductor layer 104. In the latter case, the glass substrate 102 is considered to have ended when the properties specified for a glass substrate 102 are no longer satisfied.

Figure 2:
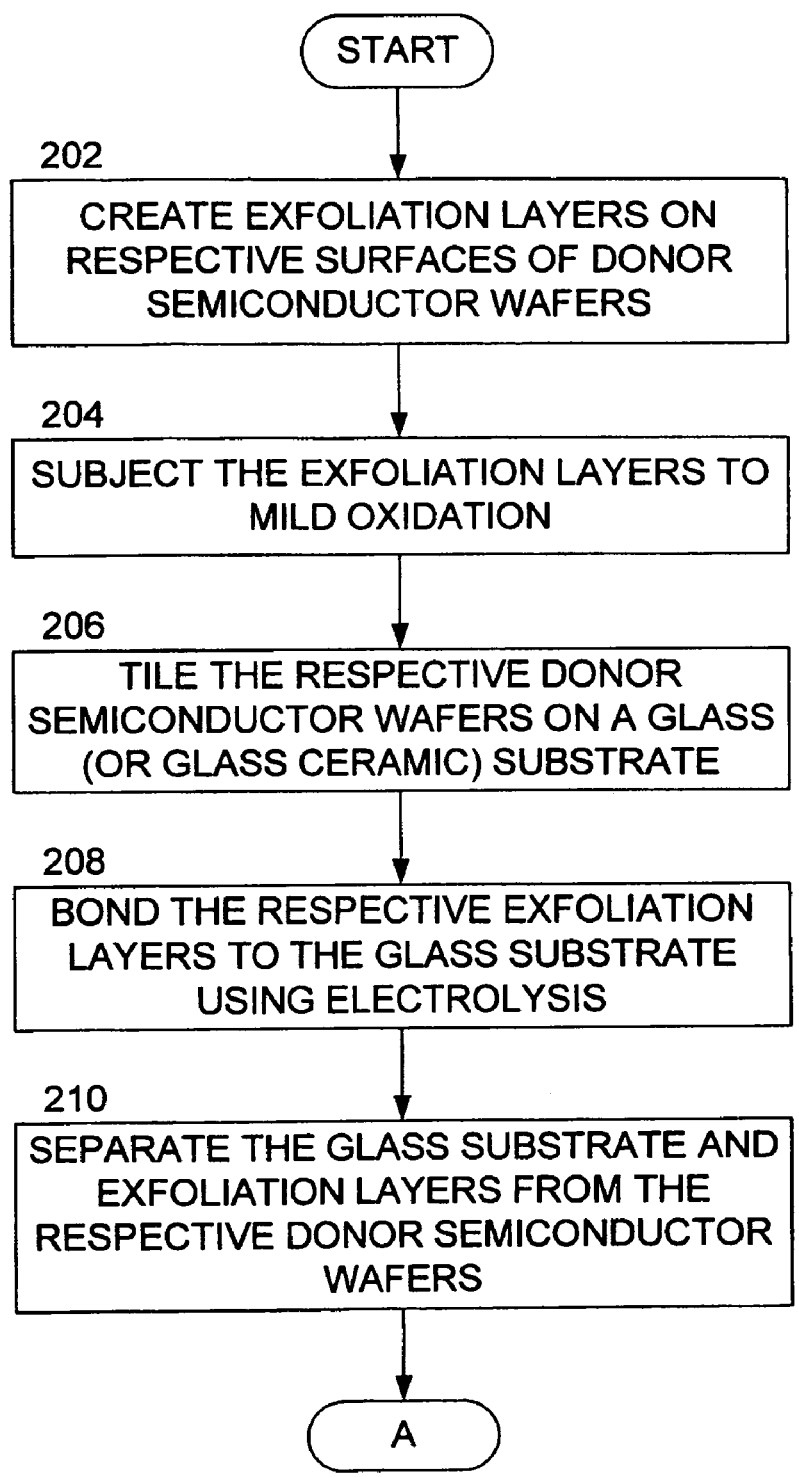
FIGS. 2-3 are flow diagrams illustrating at least some process steps that may be carried out to produce an SOI structure in accordance with one or more aspects of the present invention.
Figure 3:
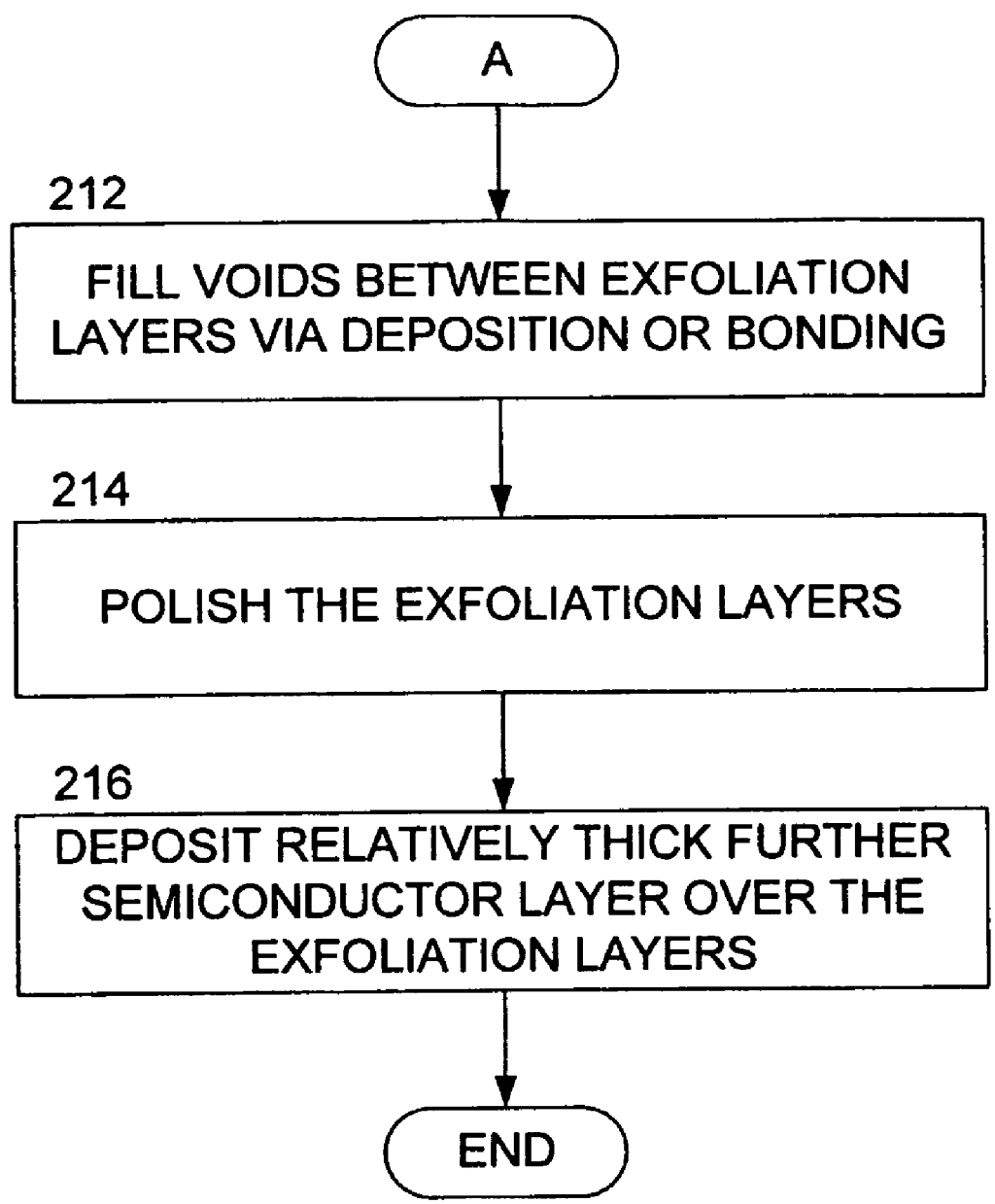
Figure 4:
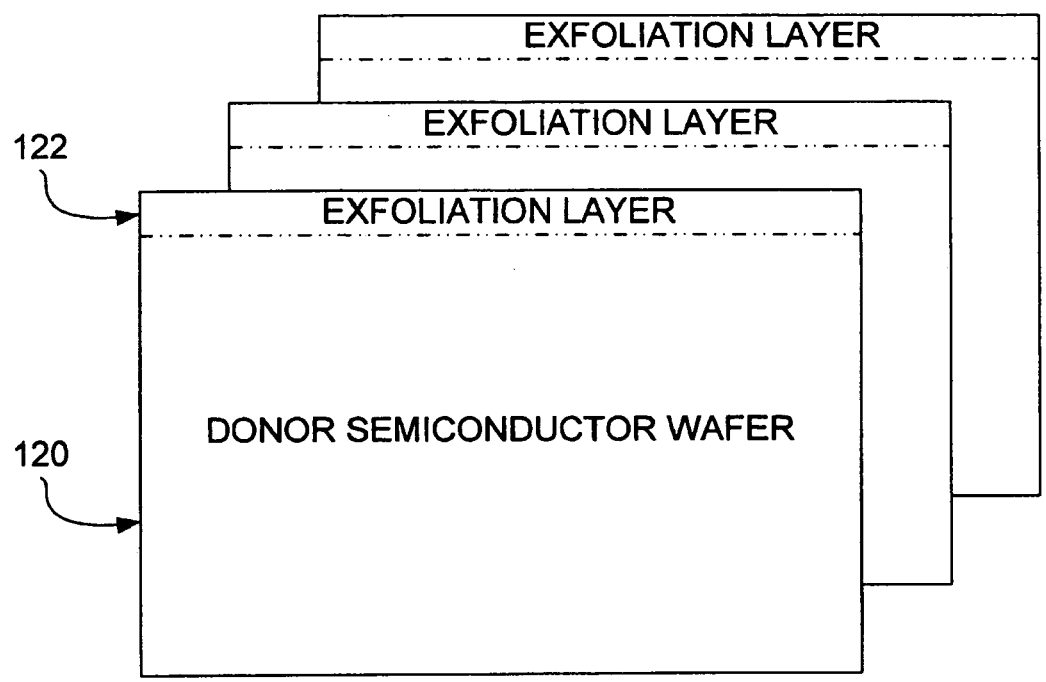
FIG. 4 is a schematic diagram of an intermediate structure that may be used in the formation of an SOI structure in accordance with one or more aspects of the present invention.

Reference is now made to FIGS. 2-8. FIGS. 2-3 illustrate process steps that may be carried out in order to produce the SOG structure 100 of FIG. 1 (and/or other embodiments disclosed herein), while FIGS. 3-8 illustrate intermediate structures that may be formed in carrying out the process of FIGS. 2-3. Turning first to FIGS. 2 and 4, at action 202, exfoliation layers 122 are formed on respective surfaces of a plurality of donor semiconductor wafers 120. For the purposes of discussion, the donor semiconductor wafers 120 are preferably formed from substantially single crystal Si wafers, although as discussed above any other suitable semiconductor conductor material may be employed. For purposes of discussion herein, the semiconductor material of the donor semiconductor wafer 120 may be referred to as silicon from time to time.

Each exfoliation layer 122 is preferably a relatively thin layer of silicon that may be separated from the associated donor semiconductor wafer 120 (which will be discussed later herein). Although the embodiments of the present invention are not limited to any particular method of forming the exfoliation layer, one suitable method includes the use of ion implantation to create a weakened region below the surface of the silicon wafer 120. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layers 122 may be employed without departing from the spirit and scope of the present invention.

No matter what technique is employed to create the exfoliation layers 122, the semiconductor wafers 120 are preferably treated to reduce the (e.g., hydrogen) ion concentration on the surfaces thereof. For example, at action 204, the semiconductor wafers 120 are preferably washed and cleaned and the exfoliation layers 122 are preferably subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen terminated surface groups oxidize to hydroxyl groups, which in turn also makes the surfaces of the semiconductor wafers 120 hydrophilic. The treatment is preferably carried out at room temperature for the oxygen plasma and at temperature between 25-150° C. for the ammonia or acid treatments.

Figure 5:
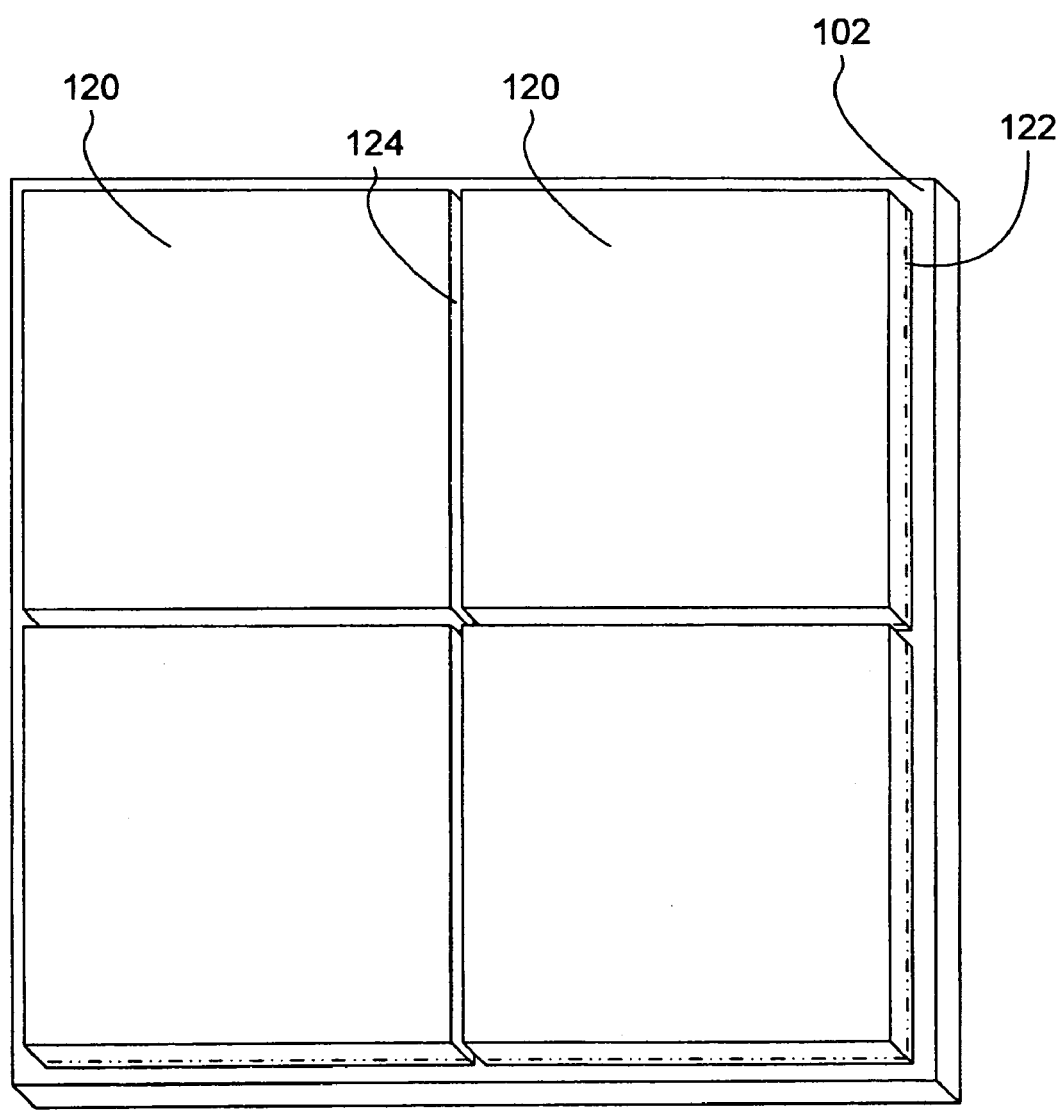
FIG. 5 is a schematic diagram of a further intermediate structure that may be used in the formation of an SOI structure in accordance with one or more aspects of the present invention.

Referring to FIGS. 2 and 5, at action 206, the plurality of semiconductor wafers 120 are disposed on the glass substrate 102 such that surfaces of the exfoliation layers 122 are in contact with the glass substrate 102. This technique may be referred to herein as "tiling." Those skilled in the art will appreciate that the various embodiments of the present invention are not limited to using semiconductor wafers 120 of a particular shape and size and that the tiling process includes the case of a single semiconductor wafer 120 that covers only part, rather than all, of the glass substrate 102. The use of tiling permits a low cost solution to producing relatively large glass or glass ceramic substrates 102 with substantially single crystal semiconductor layers 104 bonded thereto. For display or photovoltaic applications, the size of the glass substrate 102 needed is often significantly larger than the typical 300 mm diameter (0.07069 square meter) commercially available semiconductor wafers. Indeed, the size of the glass substrate 102 may be in excess of 0.07069 square meters, and may exceed 1.0 square meter.

When multiple semiconductor wafers 120 are tiled on a single glass or glass-ceramic substrate 102, voids, channels, gaps, etc. (124) between adjacent wafers 120 may be controlled by finely machining the semiconductor wafers 120 to fit closely together. By way of example, respective edges of adjacent semiconductor wafers 120 may be machined to minimize the gap or void therebetween. The edges of the semiconductor wafers 120 may be machined for a pseudo butt-joint (as illustrated in FIG. 5), or chamfered so that the edges of adjacent semiconductor wafers 120 may overlie one another—even though the edges may or may not touch one another.

Figure 6:
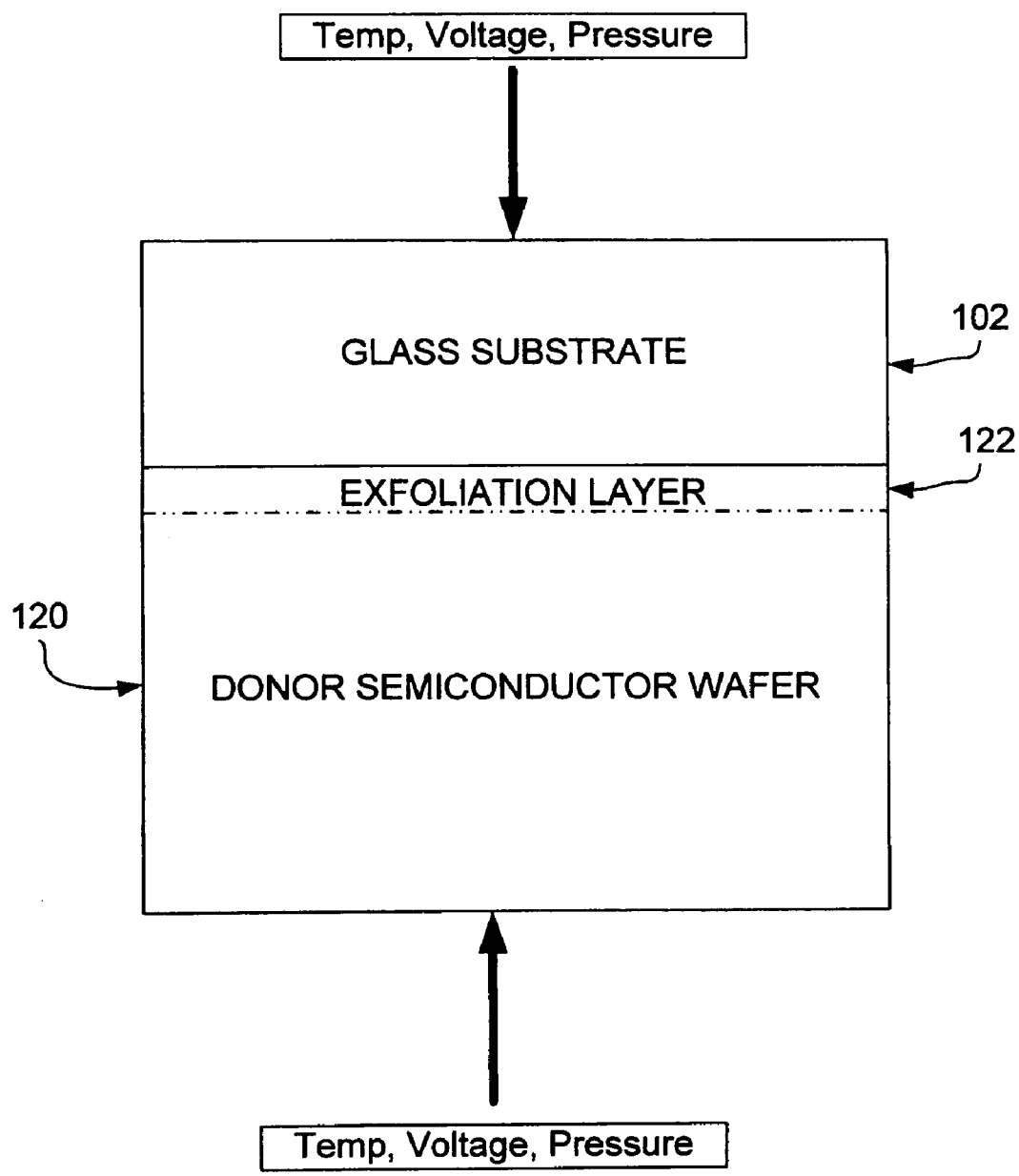
FIG. 6 is a schematic diagram of a still further intermediate structure that may be used in the formation of an SOI structure in accordance with one or more aspects of the present invention.

With reference to FIGS. 2 and 6, at action 208, the respective semiconductor wafers 120, in particular the exfoliation layers 122 thereof, are preferably bonded to the glass substrate 102 using an electrolysis process. A preferred electrolysis bonding process is described in U.S. Patent Application No. 2004/0229444, the entire disclosure of which is hereby incorporated by reference. Portions of this process are discussed below.

Mechanically induced pressure may be employed to ensure good contact between the surfaces of the respective exfoliation layers 122 and the glass substrate 102. Prior to or after the contact, the semiconductor wafer 120 and the glass substrate 102 are heated under a differential temperature gradient. Preferably the glass substrate 102 is heated to a higher temperature than the semiconductor wafer 120. By way of example, the temperature difference between the glass substrate 102 and the semiconductor wafer 120 is at least 1 degree C., although the difference may be as high as about 100 to about 150 degrees C. This temperature differential is desirable for a glass having a coefficient of thermal expansion (CTE) matched to that of the semiconductor material (e.g., silicon) since it facilitates later separation of the exfoliation layer 122 from the semiconductor wafer 120 due to thermal stresses. The glass substrate 102 and the semiconductor wafer 120 are preferably taken to temperatures within about +/−150 degrees C. of the strain point of the glass substrate 102.

If the glass substrate 102 and the semiconductor wafer 120 are heated prior to contact therebetween, the mechanical pressure is applied to the intermediate assembly to ensure good contact after the respective elevated temperatures of the glass substrate 102 and the semiconductor wafer 120 are stabilized. The preferred pressure range is between about 1 to about 50 psi. Application of higher pressures, e.g., pressures above 100 psi, might cause breakage of the glass wafer.

Next, a voltage is applied across the intermediate assembly, preferably with the semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. This accomplishes two functions: (i) an alkali or alkaline earth ion free interface is created; and (ii) the glass substrate 102 becomes very reactive and bonds to the semiconductor layer 104 strongly with the application of heat at relatively low temperatures.

Figure 7:
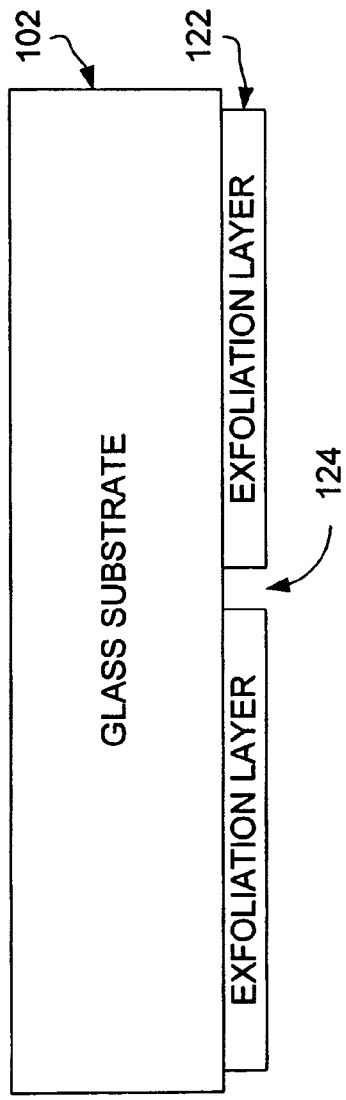
FIG. 7 is a schematic diagram of a still further intermediate structure that may be used in the formation of an SOI structure in accordance with one or more aspects of the present invention.

With reference to FIGS. 2 and 7, at action 210, after the intermediate assembly is held under the temperature, voltage and pressure conditions for some time (e.g., approximately 1 hr or less), the voltage is removed and the intermediate assembly is allowed to cool to room temperature. The semiconductor wafers 120 and the glass substrate 102 are then separated (substantially at the exfoliation layers 122), which may include some peeling if they have not already become completely free, to obtain a glass substrate 102 with the thin exfoliation layers 122 bonded thereto. The separation is preferably accomplished via fracture of the exfoliation layers 122 due to thermal stresses. Alternatively or in addition, mechanical stresses such as water jet cutting or chemical etching may be used to facilitate the separation.

As illustrated in FIG. 7, after separation, the resulting structure may include the glass substrate 102 and the plurality of exfoliation layers 122 bonded thereto, where the exfoliation layers 122 may include some voids 124 therebetween. With reference to FIG. 3, at action 212, the voids 124 may be optionally filled with semiconductor material before or after bonding. The filling of the voids 124 may be achieved using CVD or other deposition processes. If the voids 124 are filled via a deposition process at high enough temperatures, the amorphous semiconductor material filling the voids 124 may crystallize to produce a substantially single crystal semiconductor film on the glass or glass ceramic substrate 102 without any gaps.

At action 214, any unwanted semiconductor material may be removed from the exfoliation layers 122 via polishing techniques, e.g., via CMP or other techniques known in the art. Thereafter, with reference to FIGS. 3 and 8, at action 216 a further semiconductor layer 126 is disposed on the exposed surfaces of the exfoliation layers 122 to augment a thickness of the bonded semiconductor layer 104.

The further semiconductor layer 126 is preferably created via chemical vapor deposition (which may be a plasma enhanced process), sputtering, e-beam evaporation, thermal evaporation, or other suitable processes. The thickness of the further semiconductor layer 126 may be between about 1 um and about 100 um, although other thicknesses including greater thicknesses may be employed depending on the particular application of the structure 100. For example, the thickness of the further semiconductor layer 126 may be between about 1 um to about 50 um, between about 50 to 100 um, or greater than 100 um.

Figure 8:
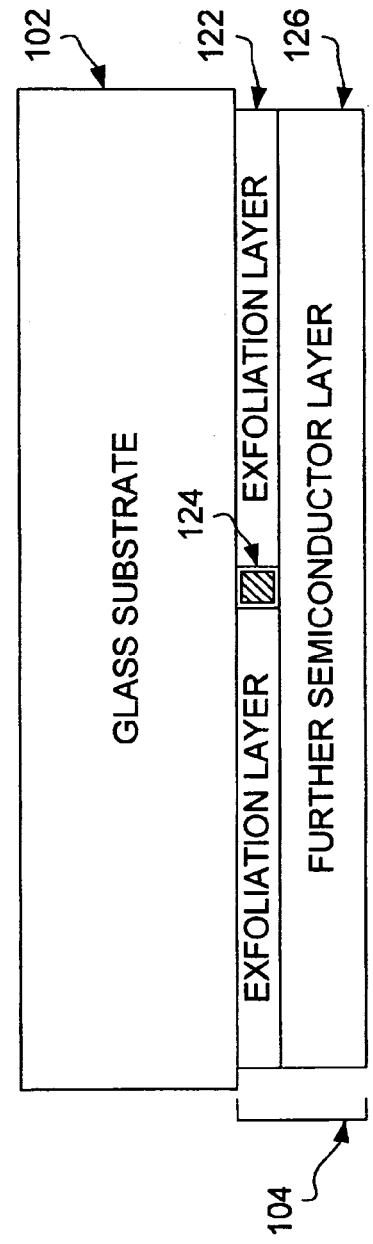
FIG. 8 is a schematic diagram of a still further intermediate structure that may be used in the formation of an SOI structure in accordance with one or more aspects of the present invention.

As illustrated in FIG. 8, the thickness of the semiconductor layer 104 is built up by the respective exfoliation layers 122 and the further semiconductor layer 126. Turning again to FIG. 3, the filling of the voids 124 between adjacent exfoliation layers 122 may be achieved at action 216 (omitting the separate filling step at action 212) by permitting at least some of the further semiconductor layer 126 to at least partially fill such voids 124 through lateral epitaxy.

Figure 9:
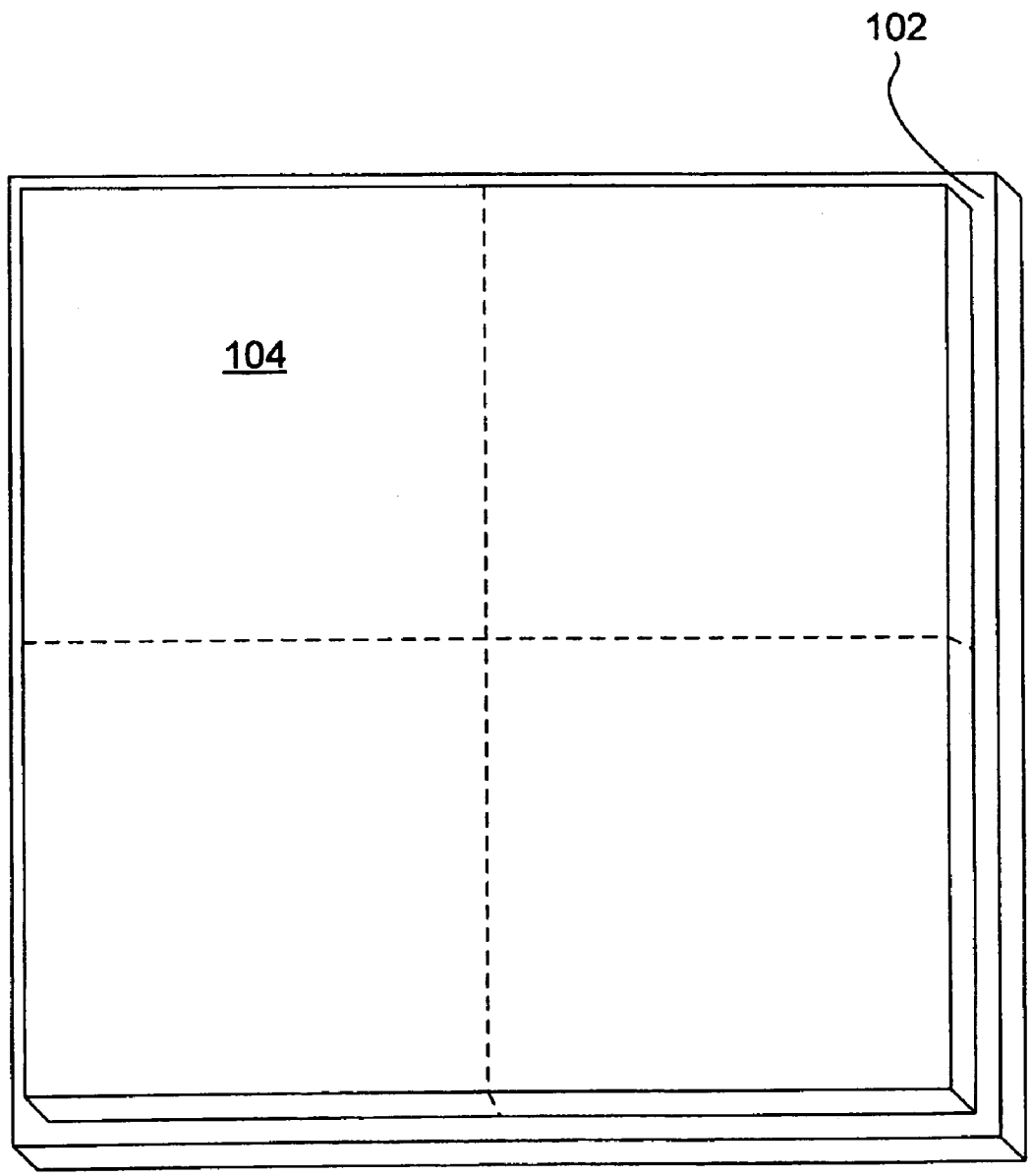
FIG. 9 is a perspective view of an SOI structure in accordance with the process flow of FIG. 2.

As illustrated in FIG. 9, the resulting SOG structure 100 includes the glass substrate 102 on which a substantially uniform single crystal semiconductor layer 104 is bonded thereto. The dashed lines are illustrated to show where the distinct exfoliation layers 122 were oriented prior to filling and/or deposition of the further semiconductor layer 126.

It is noted that the semiconductor wafer 120 may be reused to continue producing other SOI structures 100.

Figure 10:
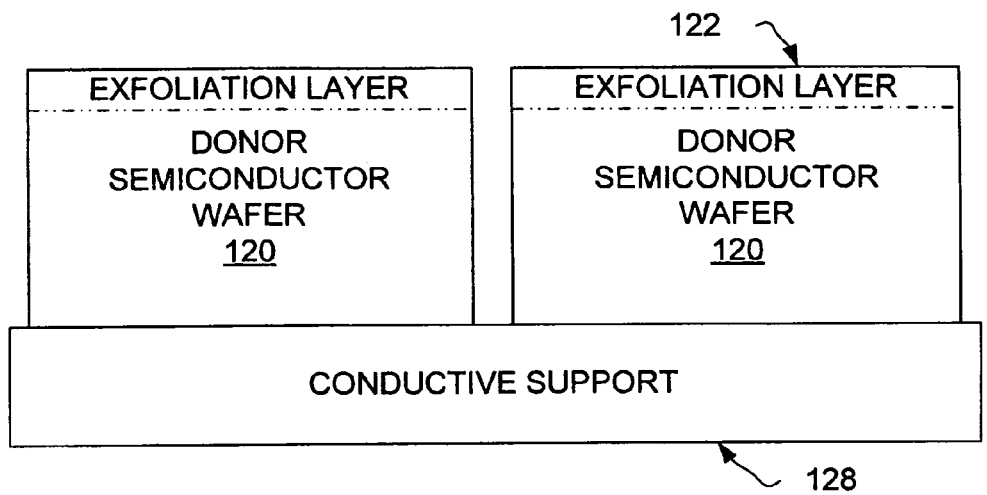
FIGS. 10-13 are schematic diagrams illustrating further intermediate structures that may be used in the formation of an SOI structure in accordance with one or more further aspects of the present invention.
Figure 11:
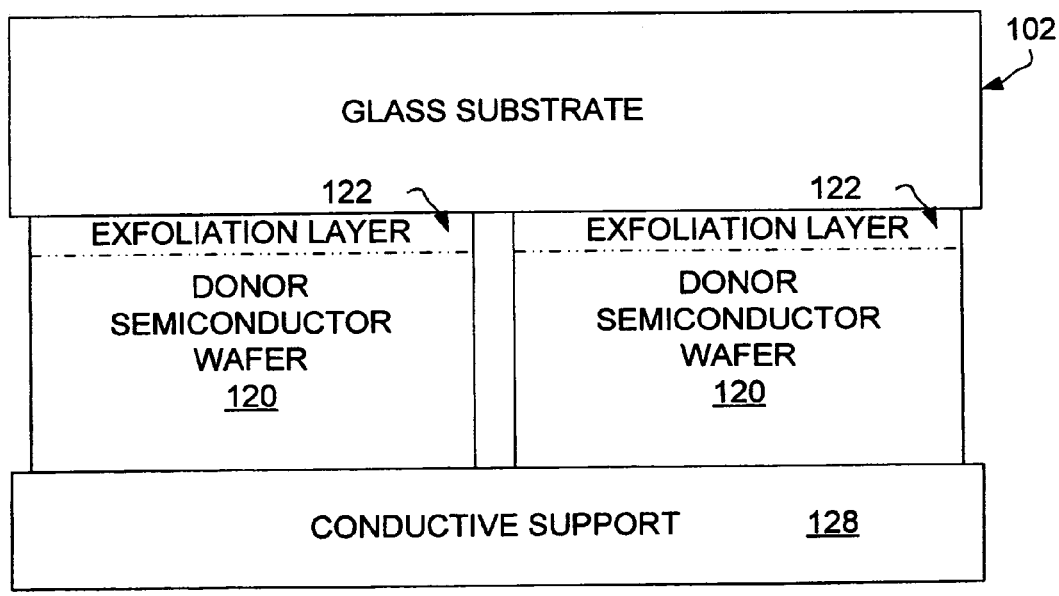
Figure 12:
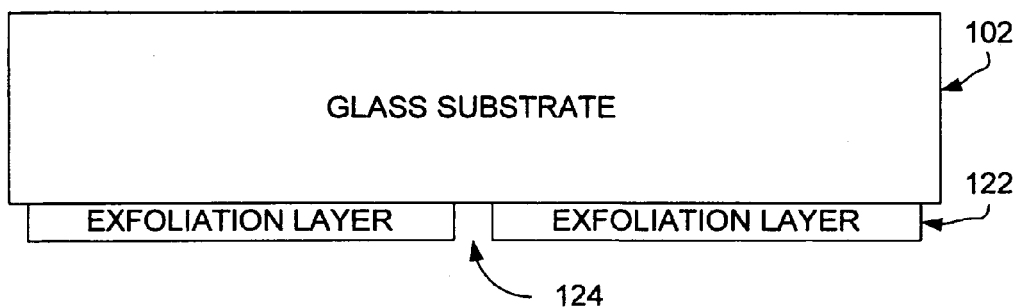

With reference to FIGS. 10-12, and in accordance with one or more further aspects of the present invention, the efficiency of the re-use process may be improved by employing a conductive support in the tiling process. As shown in FIG. 10, the plurality of donor semiconductor wafers 120 are disposed in a desired pattern and bonded to a conductive support 128. The bond can be accomplished by soldering, brazing, or using a refractory conductive glue. The conductive support 128 may be formed of a metal foil or other conductive substrate, so long as it can withstand the process temperatures. Following bonding, the exfoliation layers 122 are formed on the respective surfaces of the plurality of semiconductor wafers 120, for example, via hydrogen ion implantation. With reference to FIG. 10, the exfoliation layers 122 may be contacted with the glass substrate 102 using the conductive 128 to assist in mechanically urging the structures together.

As illustrated in FIG. 11, after ion implantation, the exfoliation layers 122 may be bonded to the glass substrate 102 using the electrolysis technique (as described above), with the assistance of the conductive support 128.

As illustrated in FIG. 12, after separation of the semiconductor wafers 120 from the glass substrate 102, the resulting structure may include the glass substrate 102 and the plurality of exfoliation layers 122 bonded thereto, where the exfoliation layers 122 may include some voids 124 therebetween. The exposed surfaces of the semiconductor wafers 120 on the conductive support 128 may be polished to remove surface roughness, and implanted again, whereupon, the bonding process with another glass or glass ceramic substrate 102 can be repeated. In this way, the semiconductor wafers 120 do not need to be separately re-oriented and separately re-assembled again on a further glass substrate 102 during the tiling process each time an SOG structure 100 is produced.

Figure 13:
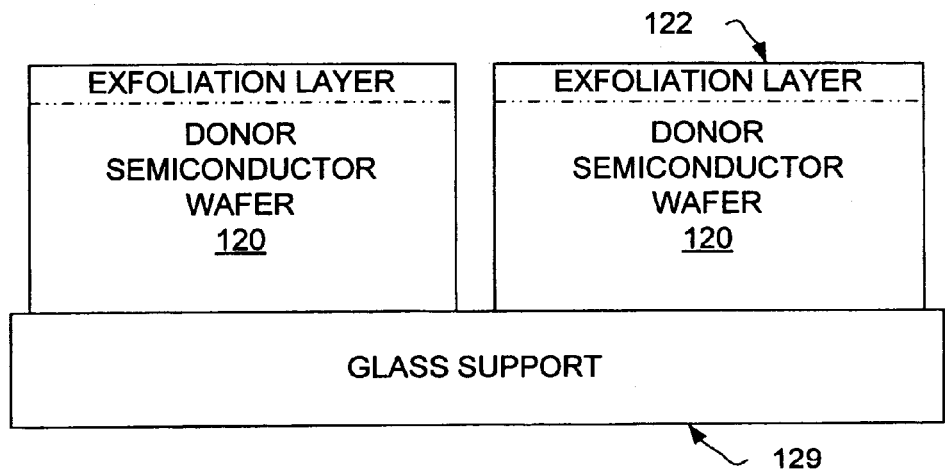

With reference to FIG. 13, and in accordance with one or more further aspects of the present invention, a glass support 129 may be used instead of the conductive support 128 in the tiling process. The plurality of donor semiconductor wafers 120 are disposed in the desired pattern and bonded to the glass support 129. As with the structure of FIG. 10, the bond of the semiconductor wafers 120 to the glass support 129 can be accomplished using conventional techniques, including refractory conductive glue, etc. Alternatively, the plurality of donor semiconductor wafers 120 may be bonded to the glass support 129 using the electrolysis technique described above with respect to FIG. 6, except that exfoliation layer 122 are not preferred at these bond sites. Following bonding to the glass support 129, the exfoliation layers 122 are formed on the respective surfaces of the plurality of semiconductor wafers 120 (opposite to the surfaces bonded to the glass support), for example, via hydrogen ion implantation (similar to that illustrated in FIG. 10). The exfoliation layers 122 may then be bonded to the glass substrate 102 (similar to that illustrated in FIG. 11) and separated from the donor semiconductor wafers 120 (similar to that illustrated in FIG. 12), each step with the assistance of the glass support 129.

To demonstrate the principle of tiling and other aspects of the present invention, a donor semiconductor wafer of 100 mm diameter silicon was boron doped and exhibited a resistivity of 1-10 ohm-cm. The donor silicon wafer was hydrogen ion implanted at dosage of $8 \times 10^{16}$ ions/cm$^2$ and energy of 100 KeV. An alumino-borosilicate glass substrate (obtained from Corning Incorporated, code 7740) of 100 mm diameter was then cleaned. The donor silicon wafer was scored and broken into two pieces. The respective pieces were then cleaned in distilled water, ammonia and hydrogen peroxide solution, dried and then assembled on the glass substrate to minimize the gap between the two silicon pieces. The assembly was then placed in a bonder, which was evacuated. The glass substrate was heated to 450 degrees C., while the silicon pieces were heated to 400 degrees C. The glass substrate was connected to the negative electrode of the bonder, while the silicon pieces were connected to the positive electrode of the bonder. After the desired temperatures were achieved, a 10 psi pressure was applied to ensure good contact between the structures. A potential of 750 volts was then applied across the glass substrate and semiconductor pieces (substantially in the centers thereof) for one minute to start the bonding process. Thereafter the voltage was removed and a lower potential of 500 volts was applied across the respective surfaces of the glass substrate and semiconductor pieces for fifteen minutes. Thereafter, the electric potential was removed and the assembly was cooled to room temperature. The silicon pieces were easily removed from the assembly leaving respective thin exfoliated silicon films on substantially the entire glass substrate. The distance between the exfoliated silicon films was about 10 um. The above experiment was repeated except that the donor silicon wafer was separated into five pieces and assembled on the 100 mm glass substrate. The exfoliated layers of silicon were successfully bonded to the glass substrate.

Figure 14:
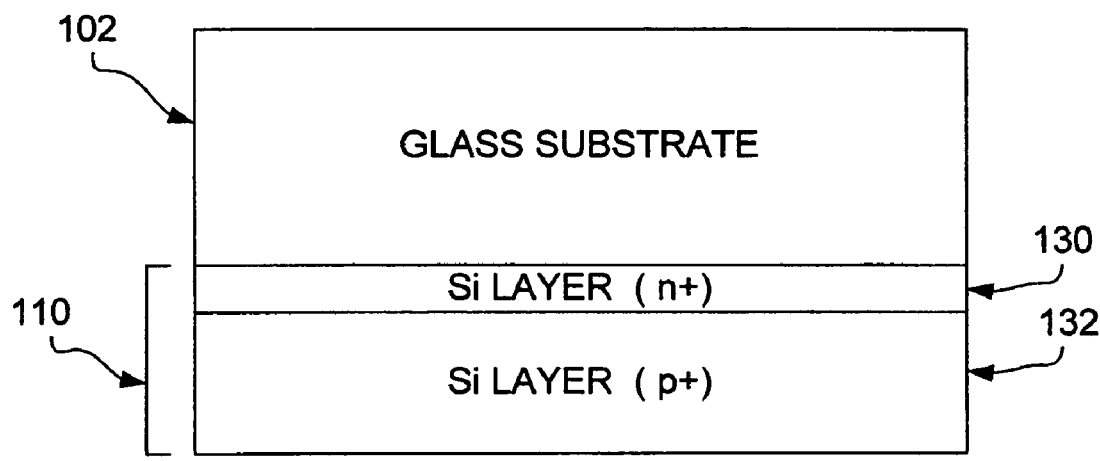
FIG. 14 is a schematic diagram illustrating an SOG structure that may be used in a photovoltaic application in accordance with one or more further aspects of the present invention.

With reference to FIG. 14, the SOG structure 100 may be used to produce a photovoltaic apparatus 140. In particular, a silicon layer 130 closest to the glass substrate 102 may be doped with n+ impurities and a next silicon layer 132 may be doped with p+ impurities. By way of example, the silicon layer 132 may be gradually boron doped. Those skilled in the art will appreciate that photovoltaic structures may be achieved using different types of impurities and different types of semiconductor materials, all of which are contemplated herein. For example, the photovoltaic junction may be such that the silicon layer 130 closest to the glass substrate 102 may be doped with p+ impurities and the next silicon layer 132 may be doped with n+ impurities. The silicon layer 130 is preferably on the order of about 300 nm thick (or less), while the silicon layer 132 is preferably on the order of about 50 um thick (or greater). The thickness of the layer 132 will affect the current producible by the photovoltaic structure 140—the thickness of the layer 132 is preferably on the order of about 5 to 100 um. Respective electrical contacts (not shown) may be coupled to the silicon layers 130, 132 to serve as the opposing voltage potential nodes of the photovoltaic structure 140. The area of the layers 130, 132 affect the terminal voltage potential producible by the photovoltaic structure 140—it is desirable that the photovoltaic structure 140 have a surface area exceeding 0.07069 square meters, where an area of about one square meter or more is preferred. The combination of the relatively thick layer 132 and relatively large areas of the layers 130, 132 yields significant electrical current and voltage (output power) from the apparatus 140 as opposed to devices have smaller layer thickness and/or smaller surface areas.

In one or more embodiments, a photovoltaic surface area exceeding 0.07069 square meters, e.g., 0.1 square meters and preferably on the order of one square meter or more, may be formed using the tiling technique discussed above to produce a silicon layer 130 of about 300 nm thickness on a glass substrate 102 of about one square meter or more. Thereafter, a silicon layer 132 of about 50 um thickness may be deposited on the silicon layer 130 via chemical vapor deposition, sputtering, e-beam evaporation, thermal evaporation, or other suitable processes.

Notably, in one or more embodiments the glass substrate 102 remains substantially transparent to light of desired wavelengths during the deposition process (specifically the heating cycle) of the layer 132. Thus, the glass substrate 102 operates as a "superstrate" for the other layers 130, 132 of the photovoltaic structure 140. In addition, in one or more embodiments, the glass or glass-ceramic substrate 102 is designed to match the coefficient of thermal expansion (CTE) of the layer 130 and/or layer 132 (e.g., silicon, germanium, etc.) such that the heating cycle(s) of the CVD growth process to produce the layer 132 do not adversely affect the mechanical properties of the bonds of the layers 130, 132 to the glass substrate 102. The CTE match between the glass substrate and the layers 130, 132 also improve durability of the photovoltaic structure 140 during thermal cycles experienced in outdoor operation. Further, the glass substrate 102 offers mechanical strength and resistance to outdoor elements (such as rain, acidity, snow, etc.). Thus, the n-p (or p-n) junction of the layers 130, 132 is protected during use of the photovoltaic structure 140.

Figure 15:
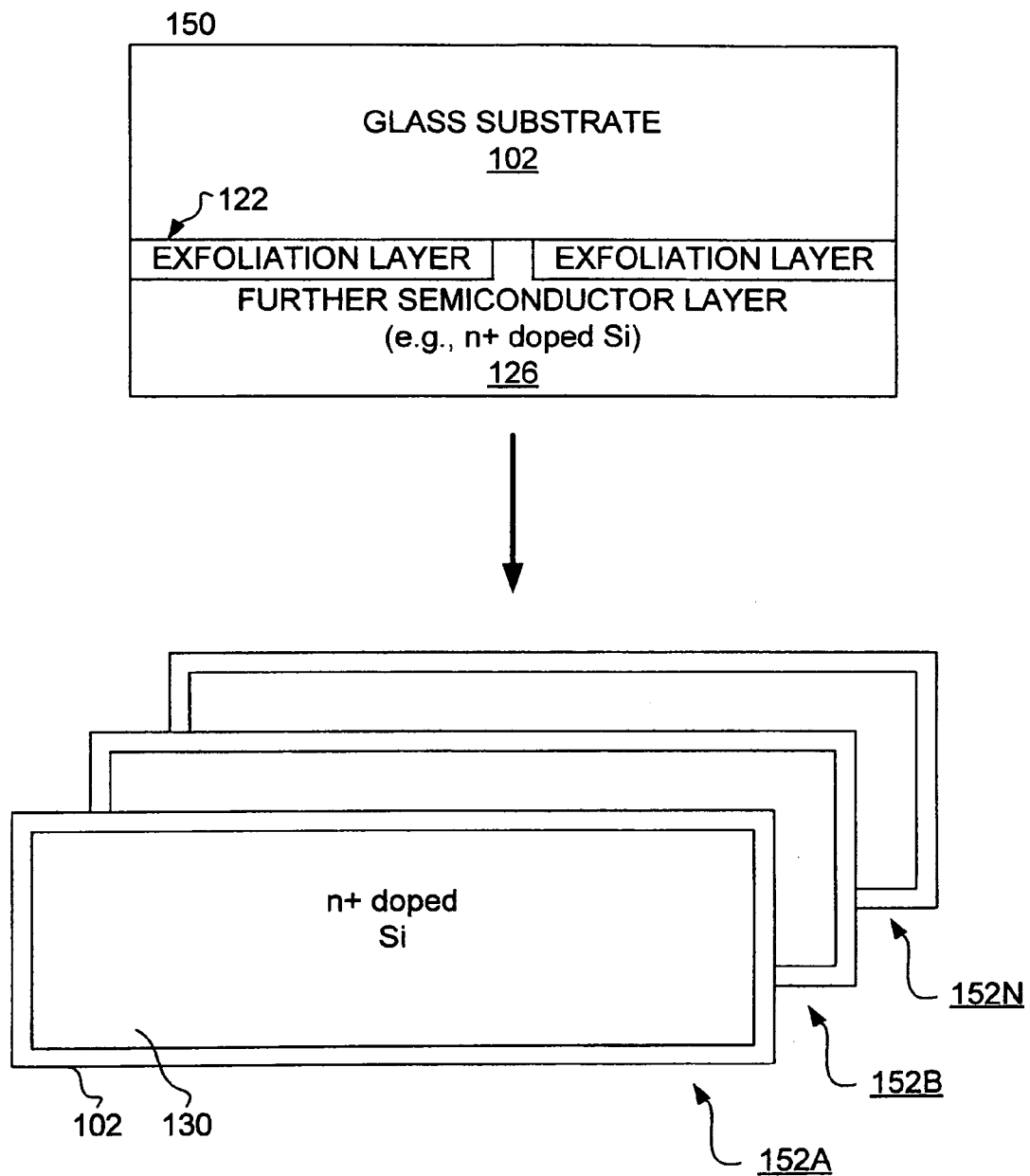

With reference to FIG. 15, in one or more further embodiments, a photovoltaic surface area exceeding 0.07069 square meters, e.g., 0.1 square meters and preferably on the order of one square meter or more, may be formed by producing an intermediate or "mother" structure 150 using the tiling and deposition techniques discussed above to produce, e.g., an n+ doped silicon layer 126 of significant thickness (e.g., multiple times the 300 nm thickness of the silicon layer 130) and of significant area (e.g., about one square meter or more) on the exfoliation layers 122. As will be apparent to one of ordinary skill in the art, the specific doping material and semiconductor material used to produce the layer 126 may be varied depending on the particular photovoltaic structure desired. The mother structure 150 is used as a donor to produce multiple "daughter" structures 152A, 152B, ... 152N, each of the same square area as the doped silicon layer 126. In particular, daughter structures 152A, 152B, etc. may be formed by creating exfoliation layers in the silicon layer 126 (e.g., using the ion implantation technique or other techniques) as discussed above with respect to the SOG structure 100. The exfoliation layers are bonded to respective glass substrates 102 using the electrolysis technique discussed above. Thus, the exfoliation layers become the respective silicon layers 130 on the glass substrates 102 of the daughter structures 152A, 152B, etc. This process preferably involves re-using the n+ doped silicon layer 126 as a donor layer to produce the multiple daughter structures 152A, 152B, ... 152N. Next, a p+ doped silicon layer 132 of about 50 um thickness may be deposited on the silicon layer 130 of each daughter structure 152, e.g., via chemical vapor deposition or other suitable processes (FIG. 14). As will be apparent to one skilled in the art, the layer 126 may be p+ doped and the layer 132 may be n+ doped, all depending on the design specifications. This results in multiple photovoltaic structures 140, one of which is shown in FIG. 14.

Figure 16:
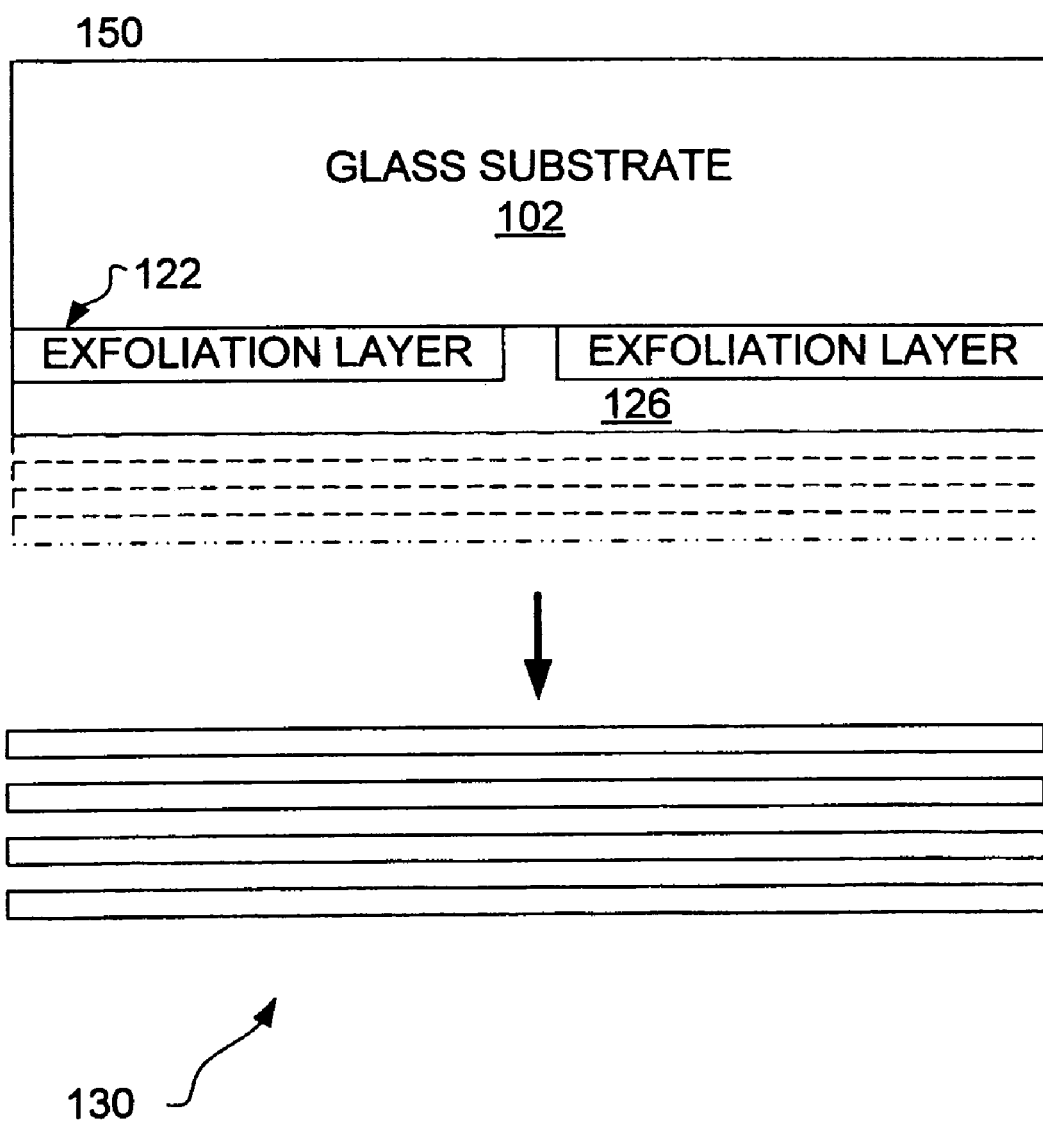

With reference to FIG. 16, the respective uses of the n+ doped silicon layer 126 is illustrated, each such use producing a respective n+ doped silicon layer 130 bonded to a respective glass substrate 102 of a daughter structure 152. Each use of the n+ doped silicon layer 126 results in a corresponding reduction in the thickness of the layer 126. At some number of uses, the thickness of the layer 126 will not be sufficient to continue using the layer 126 as a donor. Instead of discarding the mother structure 150, however, according to one or more embodiments, a further step of depositing, e.g., n+ doped silicon on the remainder of the layer 126 via chemical vapor deposition or other suitable processes. This results in a further re-usable mother structure 152 to produce further daughter structures 152 in accordance with the process discussed above. The n+ doped silicon layer 126 may be re-vitalized any number of times by depositing n+ doped silicon on the remainder of the layer 126.

As illustrated in FIG. 17, in accordance with one or more embodiments, a daughter structure 152A may be employed as a donor to produce respective layers 130 (e.g., of n+ doped silicon) for further daughter structures (not shown). In particular, the deposition technique(s) discussed above may be used to produce a layer 126 (e.g., n+ doped silicon) of significant thickness and of significant area on the layer 130 of an existing daughter structure 152A (i.e., the structure 152A produced from the mother structure 150 of FIG. 16) to produce the daughter donor structure 152A. In this regard, the layer 130 of the existing daughter structure 152A is a "seed" layer to receive the deposited layer 126. Again, as will be apparent to one of ordinary skill in the art, the specific doping material and semiconductor material used to produce the layer 126 may be varied depending on the particular photovoltaic structure desired. The daughter donor structure 152A is used as a donor to produce multiple further "daughter" structures (not shown). Again, the further daughter structures may be formed by creating exfoliation layers in the silicon layer 126 (e.g., using the ion implantation technique or other techniques) as discussed above with respect to the SOG structure 100. The exfoliation layers are bonded to respective glass substrates 102 using the electrolysis technique discussed above and separated to produce the layers 130 (e.g., of n+ doped silicon).

Each use of the n+ doped silicon layer 126 of the daughter donor structure 152A results in a corresponding reduction in the thickness of the layer 126. Again, at some number of uses, the thickness of the layer 126 will not be sufficient to continue using the layer 126 as a donor; however, the layer 126 may be re-vitalized any number of times by depositing further material (e.g., n+ doped silicon) on the remainder of the layer 126.

In one or more further embodiments, the glass substrate 102 of the mother structure 150 or the daughter donor structure 152A may be substituted with a non-transparent substrate material, such as ceramic, non-transparent glass or glass-ceramic, semiconductor material, etc. A desirable feature of the substrate, however, is that the substrate is designed to match a coefficient of thermal expansion (CTE) of the exfoliation layers 122 (of the mother structure 150) and/or the layer 130 (of the daughter donor structure 152A) such that the heating cycles of the CVD growth process to produce the layer 126 do not adversely affect the mechanical properties of the bonds to the substrate.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a semiconductor on glass structure, comprising:
bonding respective first surfaces of a plurality of donor semiconductor wafers on a conductive carrier substrate;
contacting respective second surfaces of the donor semiconductor wafers with a glass substrate;
bonding the second surfaces of the plurality of donor semiconductor wafers to the glass substrate using electrolysis;
separating the plurality of donor semiconductor wafers from the glass substrate leaving respective exfoliation layers bonded to the glass substrate;
depositing a further semiconductor layer on exposed surfaces of the exfoliation layers to augment a thickness of the exfoliation layers;
polishing respective newly exposed second surfaces of the donor semiconductor wafers;
creating respective exfoliation layers by performing ion implantation to create respective areas of weakening below the newly exposed second surfaces of the respective donor semiconductor wafers; and
bonding the second surfaces of the plurality of donor semiconductor wafers to another glass substrate using electrolysis.

2. The method of claim 1, further comprising:
separating the plurality of donor semiconductor wafers from the other glass substrate leaving respective exfoliation layers bonded to the other glass substrate; and
depositing a further semiconductor layer on exposed surfaces of the exfoliation layers to augment a thickness of the exfoliation layers.

3. The method of claim 2, wherein:
the step of depositing the further semiconductor layer includes using chemical vapor deposition; and
the deposition fills at least some voids between adjacent exfoliation layers through lateral epitaxy.

4. The method of claim 2, wherein the step of depositing the further semiconductor layer includes depositing between about 1 to 100 um of semiconductor material on the exfoliation layers.

5. The method of claim 2, wherein an area of the glass substrate covered by the plurality of exfoliation layers is at least 0.15 square meters.

6. The method of claim 2, wherein at least one of the donor semiconductor wafers and the further semiconductor layer are taken from the group consisting of: silicon (Si), germanium-doped silicon (SiGe), silicon carbide (SiC), germanium (Ge), gallium arsenide (GaAs), GaP, and InP.

7. The method of claim 2, wherein the glass substrate is a glass ceramic substrate.

8. The method of claim 2, wherein the exfoliation layers include one type of impurities and the further semiconductor layer includes another type of impurities such that the resulting structure may be employed as a photovoltaic device.

9. The method of claim 1, wherein an area of the glass substrate covered by the exfoliation layer is about 0.1 square meters or more.

10. The method of claim 1, wherein an area of the glass substrate covered by the exfoliation layer is at least about 1.0 square meters.

11. A method of forming a semiconductor on glass structure, comprising:
bonding a plurality of semiconductor layers to a substrate to cover about 0.1 square meters or more of the substrate;
depositing a donor semiconductor layer on exposed surfaces of the bonded semiconductor layers to augment a thickness thereof;
contacting a first surface of the donor semiconductor layer with a glass substrate;
bonding the first surface of the donor semiconductor layer to the glass substrate using electrolysis;

separating the donor semiconductor layer from the glass substrate leaving an exfoliation layer bonded to the glass substrate;

depositing a further donor semiconductor layer on an exposed surface of the exfoliation layer to augment a thickness thereof;

contacting a first surface of the exfoliation layer with a further glass substrate;

bonding the first surface of the exfoliation layer to the glass substrate using electrolysis; and separating the further donor semiconductor layer from the further glass substrate leaving a further exfoliation layer bonded to the further glass substrate.

12. The method of claim 11, further comprising repeating the contacting, bonding, and separating steps of the further donor semiconductor layer to produce respective further exfoliation layers bonded to respective further glass substrates.

* * * * *